United States Patent [19]
Arai et al.

[11] Patent Number: 5,458,695
[45] Date of Patent: Oct. 17, 1995

[54] SOLAR CELL AND PROCESS FOR FABRICATING THE SAME

[75] Inventors: Yasuyuki Arai; Setsuo Nakajima, both of Kanagawa, Japan

[73] Assignee: Semiconductor Energy Laboratory Co., Ltd., Kanagawa, Japan

[21] Appl. No.: 186,540

[22] Filed: Jan. 26, 1994

[30] Foreign Application Priority Data

Jan. 27, 1993 [JP] Japan .................................. 5-031287

[51] Int. Cl.$^6$ ........................ H01L 31/06; H01L 31/18
[52] U.S. Cl. .................. 136/256; 136/258; 136/290; 437/2; 437/4
[58] Field of Search ................ 136/256, 258 AM, 136/258 PC, 290; 437/2–5, 203

[56] References Cited

U.S. PATENT DOCUMENTS 4,434,318  2/1984  Gibbons ............................ 136/258
4,818,337  4/1989  Barnett et al. .................... 156/659.1

FOREIGN PATENT DOCUMENTS 58-77263   5/1983  Japan .................................. 136/290
1-211980   8/1989  Japan .................................. 136/256

Primary Examiner—Aaron Weisstuch
Attorney, Agent, or Firm—Sixbey, Friedman, Leedom & Ferguson; Gerald J. Ferguson, Jr.; Stuart J. Friedman

[57] ABSTRACT

A solar cell fabricated on an insulative substrate, which comprises a first electrode formed on said insulative substrate, a photovoltaic conversion layer formed on said first electrode, an insulative layer formed on said photovoltaic conversion layer, and a second electrode formed on said insulative layer, wherein said insulative layer comprises a plurality of openings in which said second electrode is electrically connected with the photovoltaic conversion layer. Also claimed is a process for fabricating the same.

22 Claims, 4 Drawing Sheets

FIG. 2 ( A )
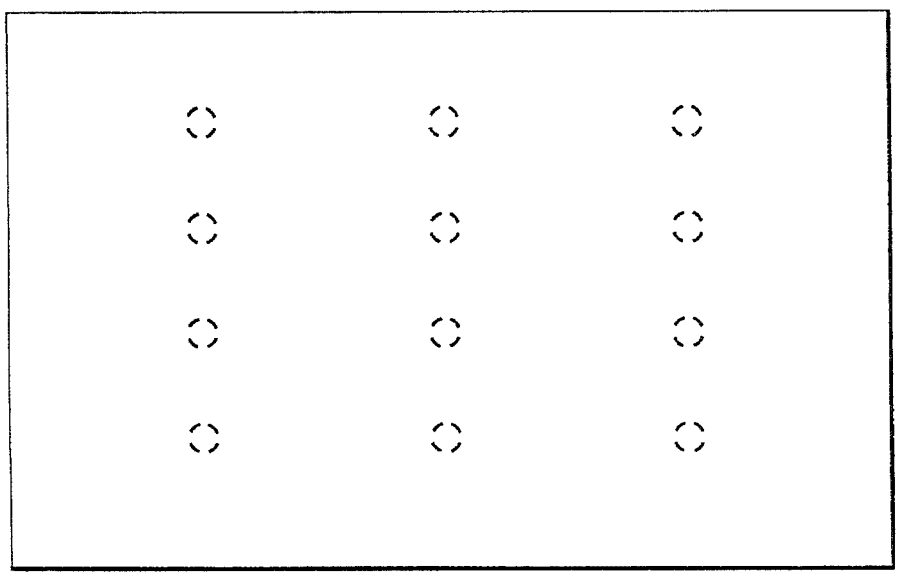
FIG. 2 ( B )
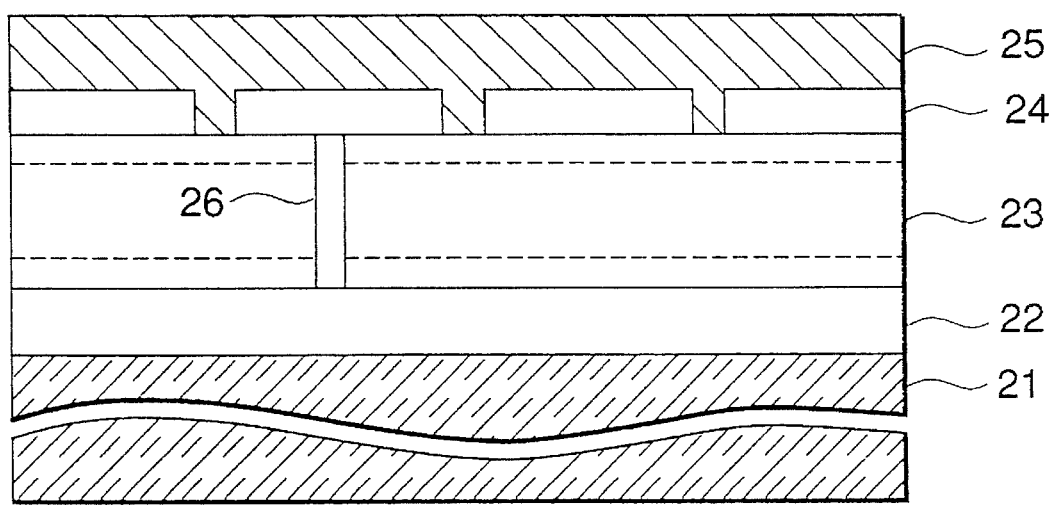

SOLAR CELL AND PROCESS FOR FABRICATING THE SAME

BACKGROUND OF THE INVENTION

1. Field of the Invention

The present invention relates to a solar cell which is formed on a substrate made from an insulator such as glass. In particular, the present invention provides an amorphous solar cell suitable for use under circumstances of low illuminance, for example, where a white fluorescent light is used.

2. Prior Art

Referring to FIG. 1, an amorphous solar cell generally comprises an insulative substrate 11, having on the principal surface thereof a layered structure consisting of, in this order from the substrate side, a clear electrode 12, a photovoltaic conversion layer 13 comprising a PIN junction and comprising amorphous silicon, and a metallic electrode 14.

The photovoltaic conversion layer 13 is fabricated by a glow discharge process, i.e., by decomposing silane and depositing the resulting product on the substrate having thereon the clear electrode. A photovoltaic conversion layer having at least a thickness of about 1 µm is required for an amorphous solar cell. However, because poor adhesion of the amorphous silicon to the clear electrode 12 occurs due to, for example, the surface conditions and stains of the glass substrate and the clear electrode, fine pinholes 16 which penetrate the photovoltaic conversion layer 13 are often formed in the photovoltaic conversion layer.

If a metal electrode 14 is formed on the photovoltaic conversion layer 13 comprising a pinhole 16, direct contact would be established between the metal electrode 14 and the clear electrode 12, because the pinhole would be filled with the material of the metal electrode. The resulting portion of direct contact can no longer contribute to the photovoltaic conversion; more disadvantageously, it would provide a short circuit and allow a leakage current to flow through the pinholes 16. This results in solar cells of poor quality.

Amorphous solar cells are used not only in the outdoors under the sunlight, but also in the indoors under a light of low illuminance, i.e., under a fluorescent lamp having an illuminance of about 1,000 lux or lower. In cases where the solar cells are used indoors, the influence of the leakage current which flows through the pinholes 16 is not negligible because the electric current which is generated in the solar cell decreases with lower illuminance. This results in solar cells with extremely impaired output characteristics.

Accordingly, the substrates are cleaned with great care before forming the photovoltaic conversion layer 13, such that no pinholes should be generated in the photovoltaic conversion layer However, it is still impossible to completely prevent the pinholes from being formed in the photovoltaic conversion layer 13. It has been found that such pinholes are the cause for lowering of the product yield.

SUMMARY OF THE INVENTION

An object of the present invention is to overcome the aforementioned problems of the conventional amorphous solar cells, and to improve the characteristics of a solar cell by preventing the leakage current ascribed to pinholes formed in the photovoltaic conversion layer of the solar cell from occurring.

Accordingly, the present invention provides a solar cell comprising a photovoltaic conversion layer having thereon a metal electrode, and an insulative layer being incorporated between the electrode and the photovoltaic conversion layer, characterized in that said insulative layer comprises a plurality of openings in such a manner that the photovoltaic conversion layer is brought into direct contact with the metal electrode.

BRIEF DESCRIPTION OF THE DRAWINGS

FIGS. 2(A) and 2(B) show the structure of a solar cell described in Example 1 according to an embodiment of the present invention, wherein FIG. 2(A) is a planar view and FIG. 2(B) is a cross sectional view;

DETAILED DESCRIPTION OF THE INVENTION

Figure 1:
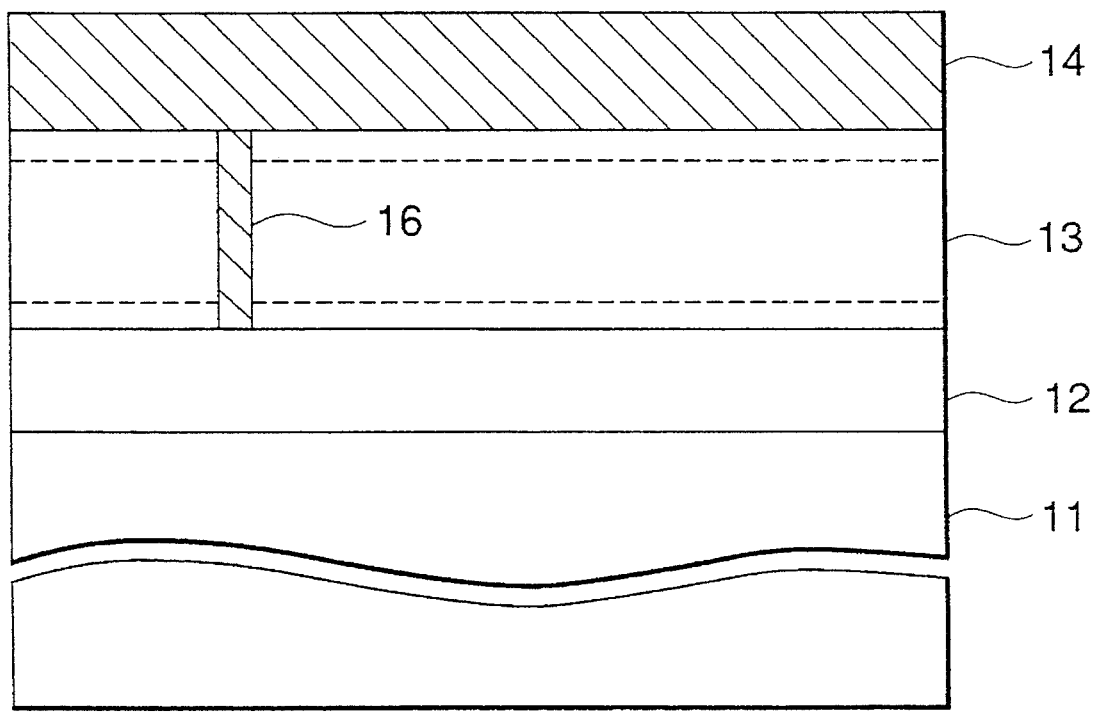
FIG. 1 is the cross sectional view of a prior art amorphous solar cell.

As described in the foregoing, the present invention provides a solar cell comprising a photovoltaic conversion layer having thereon a metal electrode, with an insulative layer incorporated between the electrode and the photovoltaic conversion layer, wherein said insulative layer comprises a plurality of openings in such a manner that the photovoltaic conversion layer is brought into direct contact with the metal electrode.

The above characteristic structure of the present invention provides a solar cell having reduced occurrence of unfavorable short circuits attributed to pinholes in the photovoltaic conversion layer. Accordingly, the present invention provides amorphous solar cells with an increased product yield.

Furthermore, because the solar cells according to the present invention comprise an insulative layer on the photovoltaic conversion layer, the generation probability of short circuits and leakage current can be considerably lowered even if a large pinhole should be formed in the photovoltaic conversion layer. In addition, the insulative layer prevents the constituent material of the metal electrode from being migrated during the fabrication and long term use of the cell. Accordingly, the present invention provides a highly reliable solar cell improved in overall characteristics.

In the case where the solar cell of the present invention is an amorphous silicon solar cell, the photovoltaic conversion layer has a thickness of 1000 Å to 2 µm. In the case where the solar cell of the present invention is a polysilicon solar cell, the photovoltaic conversion layer has a thickness of 1 to 50 µm.

The present invention is illustrated below in greater detail referring to non-limiting examples. It should be understood, however, that the present invention is not to be construed as being limited thereto.

EXAMPLE 1

Referring to FIGS. 2(A) and 2(B), the fabrication process of a solar cell according to a first embodiment of the present invention is described below in detail.

A first electrode 22, which is made of a light-transmitting electrically conductive film (such as tin oxide, ITO (indium tin oxide), and zinc oxide), is formed by thermal CVD (chemical vapor deposition), sputtering, etc., on a glass substrate 21, i.e., a light-transmitting insulative substrate. A photovoltaic conversion layer 23 is then formed on the thus obtained first electrode 22 by a glow discharge process. The photovoltaic conversion layer consists of a PIN junction comprising a layered structure obtained by sequentially forming, in this order, a P-type amorphous silicon carbide layer, an intrinsic (I-type) amorphous silicon layer, and an N-type microcrystalline silicon layer. FIG. 2(B) shows a state in which a pinhole 28 is present in the photovoltaic conversion layer An insulative layer 24 is formed uniformly on the entire surface of the photovoltaic conversion layer 23. The insulative layer 24 is a silicon nitride or a silicon oxide layer, and is formed by a glow discharge process, sputtering, etc. The pinhole 26 is filled with the insulative material in this step of forming the insulative layer 24.

Openings are formed in the thus established insulative layer 24. The openings are provided by first forming a resist film on the insulative layer 24 in accordance with a predetermined pattern, and then partially etching the insulator layer using the patterned resist film as a mask. In this manner, some parts of the surface of the photovoltaic conversion layer 23 are exposed to obtain the openings.

In forming the openings, the insulator can be left inside the pinhole 26 by controlling the etching conditions. The residual insulator prevents penetration from occurring by the second electrode 25, which is formed later. Thus, in this manner, direct contact between the second electrode 25 and the first electrode 22 can be avoided. Accordingly, the process according to the present invention comprising forming the insulator layer 24 after forming the photovoltaic conversion layer 23 and selectively removing a part of the insulator layer, has been found greatly useful in preventing leakage current ascribed to the pinhole 28 from occurring.

In particular, the constitution of the present invention is characterized in that openings are provided in the insulative layer provided on the photovoltaic conversion layer without removing the entire insulative layer from the upper side of the photovoltaic conversion layer. In this manner, the insulative layer is left on the photovoltaic conversion layer. This minimizes the probability of generating short circuits and leakage current even when a considerably large pinhole is present in the photovoltaic conversion layer. Furthermore, in contrast with the conventional solar cells comprising a metal electrode formed directly on the photovoltaic conversion layer as a second electrode, the structure according to the present invention comprises an insulative layer between the photovoltaic conversion layer and the metal electrode. This structure characteristic of the present invention prevents the migration of the constituent materials of the metal electrode from occurring during the fabrication and long term use of the cell. Thus, a reliable amorphous solar cell having excellent characteristics as a whole can be implemented.

The second electrode 25 is formed on the insulator layer 24 as shown in FIG. 2(B), using a metal such as aluminum (Al) and chromium (Cr). The structure is characterized in that the electrode is brought into contact with the photovoltaic conversion layer 23 only at the openings provided in the insulative layer 24. Thus, the series resistance of the solar cell according to the embodiment of the present invention depends only on the following factors: the size of and the distance between the openings.

The series resistance is closely related with the areal resistance of the N-type microcrystalline silicon layer which is in contact with the metal electrode 25. More specifically, the series resistance increases in proportion to the areal resistance of the N-type microcrystalline silicon layer and the distance between the openings formed in the insulative layer 24, but reduces in inverse proportion to the size of the openings formed in the insulative layer 24. Essentially, the series resistance of a solar cell is designed such that it is sufficiently low, so that it does not impair the output power of the cell. However, under a fluorescent light or any light of low illuminance, it is known that the series resistance has almost no influence on the output power.

Figure 3:
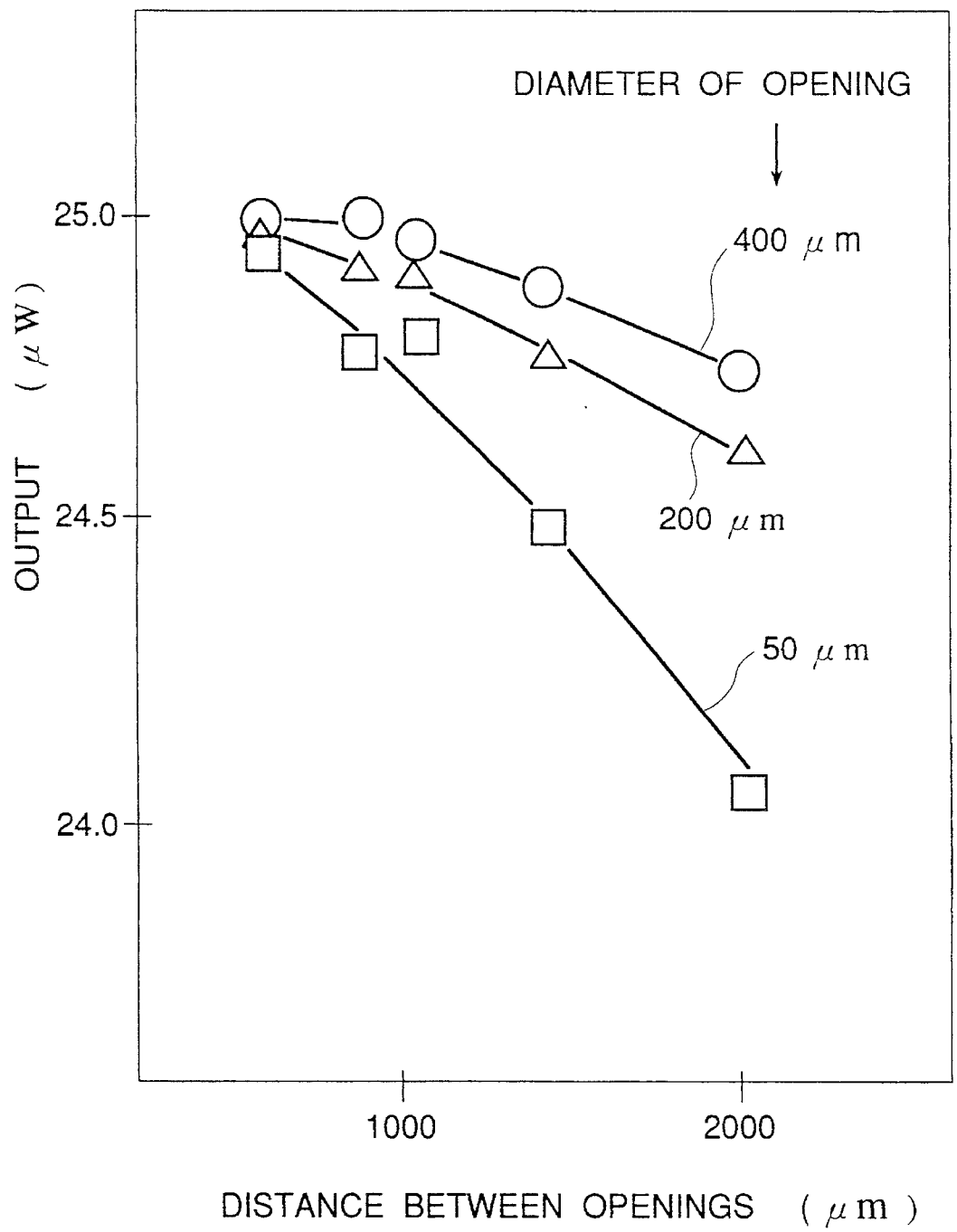
FIG. 3 is a graph showing the change of output of a solar cell according to Example 1 under a fluorescent lamp as a function of the size of and the distance between the openings provided in the insulative layer.

FIG. 3 shows the change in output power of test samples of amorphous solar cell according to an embodiment of the present invention, measured under a white fluorescent light of 500 lux. The values are obtained on test samples having openings in the insulative layer 24, in which the size of the openings and the distance between them differ from each other.

In this case, openings having a circular cross section are provided in the insulative layer 24. The diameter of the cross sectional circle is varied from 50 μm to 400 μm, and the distance between the openings (the distance between the centers of the openings) is changed in the range from 500 μm to 2,000 μm.

It can be seen from FIG. 3 that a high output well comparable to that of a solar cell of a conventional structure is obtained for a sample cell having the openings with a diameter falling in the aforementioned range, provided that the openings are arranged such that the spacing between the openings is about 1,000 μm or less. Moreover, no generation of short circuits and leakage current ascribed to pinholes is observed. Accordingly, it is confirmed that by appropriately setting the diameter and the spacing of the openings, the solar cell structure according to the present invention provides a practically useful output power when used under a white fluorescent lamp or any lighting of low illuminance.

As a matter of course, the size and shape of the openings as well as the spacing between the openings can be freely set so long as a favorable result as described in the foregoing can be obtained with the solar cell.

EXAMPLE 2

Figure 4:
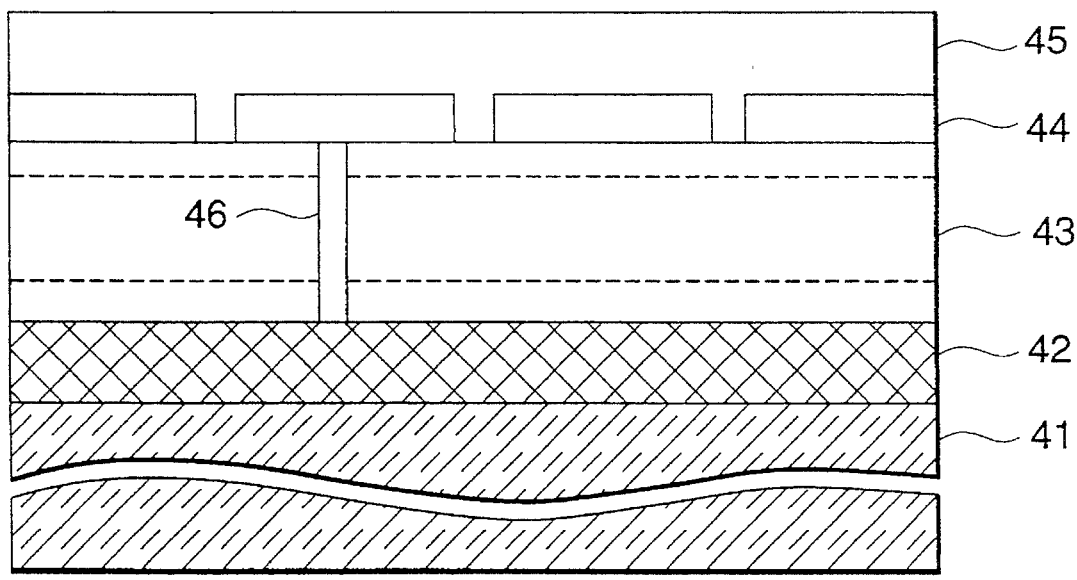
FIG. 4 shows a cross section view of a solar cell of Example 2 according to another embodiment of the present invention.

Referring to FIG. 4, a solar cell according to a second embodiment of the present invention is described below.

A first electrode 42 is formed by sputtering on a glass substrate 41 using a metal such as aluminum (Al) and chromium (Cr). Then, a photovoltaic conversion layer 43 is formed on the first electrode 42 by a glow discharge process. The photovoltaic conversion layer 43 comprises a layered PIN junction obtained by sequentially depositing an N-type amorphous silicon, an intrinsic (I-type) amorphous silicon, and a P-type microcrystalline silicon. Then, an insulative layer 44 having a plurality of openings therein is formed on the upper surface of the photovoltaic conversion layer 43 using a process similar to that used in Example 1. The second electrode 45 formed on the insulative layer 44 is a clear electrode made of, for example, tin oxide, ITO, or zinc oxide. The openings are provided with the same diameter and at the same spacing between the openings as those in Example 1. Thus, a practically feasible solar cell is obtained free of short circuits and leakage current ascribed to pinholes.

As described in the foregoing, the present invention provides an amorphous solar cell for use under a white fluorescent lamp or like lighting of low illuminance, having a sufficiently high output and yet reduced in electric failure such as short circuits which occurs due to the presence of pinholes in the photovoltaic conversion layer. Thus, the present invention provides products with an increased product yield.

Furthermore, since the amorphous solar cell according to the present invention comprises an insulative layer on the photovoltaic conversion layer, the probability of causing short circuits and leak current can be minimized even when a relatively large pinhole is present in the photovoltaic conversion layer. It also prevents the migration of the metal electrode material into the photovoltaic conversion layer from occurring during the fabrication and long-term use of the solar cell. Accordingly, an amorphous solar cell with improved reliability and overall characteristics can be obtained.

While the invention has been described in detail and with reference to specific embodiments thereof, it will be apparent to one skilled in the art that various changes and modifications can be made therein without departing from the spirit and scope thereof.

What is claimed is:

1. A solar cell comprising:

a first electrode provided on an insulative substrate;

a photovoltaic conversion layer provided on said first electrode, said photovoltaic conversion layer including pinholes which penetrate therethrough;

an insulative layer covering said photovoltaic conversion layer and filling said pinholes; and a second electrode provided on said insulator layer, wherein said insulative layer has a plurality of relatively small openings through which said second electrode is electrically connected with said photovoltaic conversion layer.

2. The cell of claim 1 wherein said photovoltaic conversion layer comprises at least one PIN junction, and the P-type or the N-type region of said photovoltaic conversion layer is provided in contact with said insulative layer and is made of microcrystalline silicon.

3. The cell of claim 1 wherein said insulative layer is made of a material selected from the group consisting of silicon nitride and silicon oxide.

4. The cell of claim 1 wherein said first electrode is a light-transmitting electrically conductive film, and said second electrode is a metal electrode.

5. The cell of claim 4 wherein said light-transmitting electrically conductive film comprises a material selected from the group consisting of tin oxide, indium tin oxide, and zinc oxide.

6. The cell of claim 4 wherein said metal electrode comprises a material selected from the group consisting of aluminum and chromium.

7. The cell of claim 1 wherein said first electrode is a metal electrode, and said second electrode is a light-transmitting electrically conductive film.

8. The cell of claim 7 wherein said metal electrode comprises a material selected from the group consisting of aluminum and chromium.

9. The cell of claim 7 wherein said light-transmitting electrically conductive film comprises a material selected from the group consisting of tin oxide, indium tin oxide, and zinc oxide.

10. The cell of claim 1 wherein said photovoltaic conversion layer comprises silicon.

11. The cell of claim 1 wherein said photovoltaic conversion layer comprises a P-type amorphous silicon carbide layer in contact with said first electrode, an intrinsic amorphous silicon layer provided on said P-type amorphous silicon carbide layer, and an N-type microcrystalline silicon layer provided on said intrinsic amorphous silicon layer in contact with said insulative layer.

12. The cell of claim 1 wherein said photovoltaic conversion layer comprises an N-type amorphous silicon layer in contact with said first electrode, an intrinsic amorphous silicon layer provided on said N-type amorphous silicon layer, and a P-type microcrystalline silicon layer provided on said intrinsic amorphous silicon layer in contact with said insulative layer.

13. The cell of claim 1 wherein said substrate is transparent.

14. The cell of claim 1 wherein said openings are circular holes having a diameter of 50 μm to 400 μm.

15. The cell of claim 14 wherein adjacent ones of said circular holes are apart from each other at a distance of 1000 μm or shorter between the centers thereof.

16. The cell of claim 1 wherein said solar cell is an amorphous silicon solar cell and said photovoltaic conversion layer has a thickness of 1000 Å to 2 μm.

17. The cell of claim 1 wherein said solar cell is a polysilicon solar cell and said photovoltaic conversion layer has a thickness of 1 to 50 μm.

18. A process for fabricating a solar cell, comprising:

forming a first electrode on an insulative substrate;

forming a photovoltaic conversion layer on said first electrode, said photovoltaic conversion layer including pinholes which penetrate therethrough;

forming an insulative layer covering said photovolatic conversion layer and filling said pinholes;

selectively etching said insulative layer for forming a plurality of relatively small openings in said insulative layer; and forming a second electrode on said insulative layer provided with said openings, wherein said second electrode is electrically connected to said photovoltaic conversion layer through said openings.

19. The process of claim 18 wherein the formation of said photovoltaic conversion layer is carried out by deposition.

20. The process of claim 18 wherein a surface of said photovoltaic conversion layer is exposed at said openings.

21. The process of claim 18 wherein said second electrode comprises a metal film.

22. The process of claim 18 wherein said second electrode comprises a transparent conductive oxide film.

* * * * *